United States Patent
Kawai

(10) Patent No.: US 6,631,171 B1
(45) Date of Patent: Oct. 7, 2003

(54) QPSK MODULATION SIGNAL RECEIVING UNIT

(75) Inventor: Satoshi Kawai, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/365,931

(22) Filed: Aug. 2, 1999

(30) Foreign Application Priority Data

Aug. 6, 1998 (JP) ............................................ 10-222748

(51) Int. Cl.[7] .............................. H04L 27/22; H04N 5/52
(52) U.S. Cl. .................... 375/332; 375/345; 329/304
(58) Field of Search .................................. 375/279, 281, 375/324, 329, 316, 332, 345; 329/304

(56) References Cited

U.S. PATENT DOCUMENTS

| | | | |
|---|---|---|---|
| 4,517,526 A | | 5/1985 | Di Cicco |
| 4,710,772 A | * | 12/1987 | Cantwell et al. ............... 342/92 |
| 5,325,401 A | | 6/1994 | Halik et al. |
| 5,528,633 A | * | 6/1996 | Halik et al. ................. 375/326 |
| 5,603,114 A | | 2/1997 | Tomita |
| 5,640,670 A | * | 6/1997 | Samueli et al. ............... 725/70 |
| 5,721,757 A | * | 2/1998 | Banh et al. .................. 375/345 |
| 5,999,559 A | * | 12/1999 | Takaki ......................... 375/130 |
| 6,011,980 A | * | 1/2000 | Nagano et al. ............... 455/572 |
| 6,134,430 A | * | 10/2000 | Younis et al. ................ 455/340 |
| 6,175,279 B1 | * | 1/2001 | Ciccarelli et al. ........... 330/296 |
| 6,208,849 B1 | * | 3/2001 | Cho et al. .................... 455/296 |
| 6,236,848 B1 | * | 5/2001 | Igarashi et al. .............. 455/341 |

FOREIGN PATENT DOCUMENTS

| | | |
|---|---|---|
| EP | 0 117 654 A1 | 9/1984 |
| EP | 0 797 299 A2 | 9/1997 |
| EP | 0 814 568 A1 | 12/1997 |
| GB | 2 060 292 A | 4/1981 |
| JP | 57 21 18 35 | 12/1982 |
| JP | Hei 8-307472 | 11/1996 |

* cited by examiner

*Primary Examiner*—Young T. Tse
(74) *Attorney, Agent, or Firm*—Brinks Hofer Gilson & Lione

(57) ABSTRACT

Reduction in an output level of an IQ demodulator starts when a QPSK modulation signal is at a first level. Reduction in an output level of a first variable attenuater occurs when the QPSK modulation signal is at a second level higher than the first level. Reduction in an output level of a second variable attenuater starts when the QPSK modulation signal is at a third level higher than the second level.

3 Claims, 3 Drawing Sheets

QPSK MODULATION SIGNAL RECEIVING UNIT

BACKGROUND OF THE INVENTION

1. Field of the Invention

The present invention relates to a QPSK modulation signal receiving unit suitable for receiving a QPSK modulated signal such as a digital television signal sent from a broadcasting satellite.

2. Description of the Related Art

The construction and operation of a conventional QPSK modulation signal receiving unit will be described with reference to FIG. 5. For example, a QPSK modulation signal such as a digital television signal received by a parabolic antenna (not shown) outdoors is subjected to frequency conversion by an outdoor converter (not shown) mounted on the outdoors and supplied to a band-pass filter 31. The signal is amplified by a variable gain amplifier 32 and the amplified signal is supplied to a mixer 33. The television signal supplied to the mixer 33 is mixed with a local oscillation signal from a local oscillator 34 and frequency converted to an intermediate frequency signal.

The intermediate frequency signal passes through a variable attenuater 35, an intermediate frequency amplifier 36, and an intermediate frequency filter 37, and is supplied to an IQ demodulator 38. The IQ demodulator 38 separates the supplied intermediate frequency signal into an I signal and a Q signal whose phases are different by 90 degrees and the I and Q signals are supplied to an A/D converter 39. The A/D converter 39 converts the I and Q signals into a digital signal and supplies the digital signal to a QPSK demodulator 40. The QPSK demodulator 40 QPSK demodulates the digital signal and supplies the QPSK demodulated signal to an error correction circuit 41.

The gain of the variable gain amplifier 32, the attenuation amount of the variable attenuater 35, and the gain of the IQ demodulator 38 are automatically controlled in accordance with the level of the received QPSK modulation signal. An automatic gain control voltage Vagc for the control is proportional (or inverse proportional) to the level of the QPSK modulation signal and is generated by the QPSK demodulator 40.

The automatic gain control voltage Vagc generated by the QPSK demodulator 40 is supplied to the variable gain amplifier 32, the variable attenuater 35, and the IQ demodulator 38. In this case, it is controlled so that the level of the QPSK modulation signal differs when the gain is changed or the attenuation is started in the variable gain amplifier 32, the variable attenuater 35, and the IQ demodulator 38.

Specifically, when the level of the received QPSK modulation signal becomes high to, for example, minus 70 dBm as a first level, first, attenuation of the gain of the IQ demodulator 38 starts. Consequently, the automatic gain control voltage Vagc is supplied to the IQ demodulator 38 after being amplified by an operational amplifier 42. When the level of the QPSK modulation signal becomes, for example, minus 45 dBm as a second level, the attenuation amount of the variable attenuater 35 starts to be increased. Further, when the level of the QPSK modulation signal rises to, for example, minus 25 dBm as a third level, the gain of the variable gain amplifier 32 starts to be decreased.

FIG. 6 shows the level change characteristics of an output level (indicated by curve X) of the IQ demodulator 38 for an input level (received level) of the QPSK modulation signal, an input level (indicated by curve Y) of the IQ demodulator 38, and an input level (indicated by curve Z) of the mixer 33.

In FIG. 6, since the gain or attenuation control does not operate until the level of the QPSK modulation signal rises to the first level A, each of the output level of the IQ demodulator 38, the input level of the IQ demodulator 38, and the input level of the mixer 33 rises according to the rise in the input level of the QPSK modulation signal. Since the gain or attenuation control of the IQ demodulator 38 starts at a time point when the input level of the QPSK modulation signal reaches the first level A, the output level of the IQ demodulator 38 becomes almost constant (about plus 4 dBm).

At the time point when the input level of the QPSK modulation signal reaches the second level B, the attenuation amount of the variable attenuater 35 starts to increase, so that the input level of the IQ demodulator 38 becomes almost constant (about minus 25dBm).

At the time point when the input level of the QPSK modulation signal reaches the third level C, reduction in the gain of the variable gain amplifier 32 starts, so that the input level of the mixer 33 becomes almost constant (about minus 15 dBm).

As described above, in the conventional unit, as the level of the QPSK modulation signal rises, the control is performed sequentially from the post stage side to the front stage side in such a manner that the gain of the IQ demodulator 38 starts to attenuate first, the attenuation amount of the variable attenuater 35 starts to increase and, finally, the gain of the variable gain amplifier 32 starts to be reduced.

In the conventional receiving unit, however, until the input level of the QPSK modulation signal rises to the third level C, the input level of the mixer 33 rises in association with the rise in the level of the QPSK modulation signal (refer to the curve Z).

On the other hand, among a number of QPSK modulation signals, some QPSK modulation signals have a low bit rate and some QPSK modulation signals have a high bit rate. The signal density of the QPSK modulation signal having a low bit rate is higher than that of the QPSK modulation signal having a high bit rate.

The input level of the QPSK modulation signal supplied to the mixer 33 is therefore high until the input level of the QPSK modulation signal reaches the third level. The QPSK modulation signal supplied to the mixer 33 is leaked to the local oscillator 34 via the mixer 33. The operation of the local oscillator 34 consequently becomes unstable due to the leaked QPSK modulation signal and phase noise of the local oscillation signal increases. As a result, a bit error increases and, moreover, a problem such that the picture quality deteriorates occurs.

SUMMARY OF THE INVENTION

It is therefore an object of the invention to provide a receiving unit in which phase noise of a local oscillation signal is not increased even when a QPSK modulation signal having a low bit rate is supplied.

According to the invention, in order to solve the problems, there is provided a QPSK modulation signal receiving unit comprising: a first level changing means for receiving a QPSK modulation signal, changing the level of the received QPSK modulation signal, and outputting a resultant signal; a mixer for frequency converting the QPSK modulation signal outputted from the first level changing means and outputting an intermediate frequency signal; a second level changing means for changing the level of the intermediate frequency signal and outputting a resultant signal; an IQ demodulator for demodulating the intermediate frequency signal outputted from the second level changing means, outputting a first intermediate frequency signal and a second intermediate frequency signal whose phases are different from each other by 90 degrees, changing the levels of the first and second intermediate frequency signals, and outputting resultant signals; and a QPSK demodulator for demodulating the first and second intermediate frequency signals outputted from the IQ demodulator and outputting a QPSK signal, wherein reduction in output level of the IQ demodulator starts when the QPSK modulation signal is at the first level, reduction in output level of the first level changing means starts when the QPSK modulation signal is at the second level higher than the first level, and reduction in output level of the second level changing means starts when the QPSK modulation signal is at the third level higher than the second level.

According to the QPSK modulation signal receiving unit of the invention, a control voltage for changing the output levels of the first level changing means, the second level changing means, and the IQ demodulator is generated by the QPSK demodulator, the first level changing means is constructed by a first variable attenuater comprising first, second, and third pin diodes which are connected in series, the second level changing means is constructed by a second variable attenuater comprising fourth and fifth pin diodes which are connected in series, a current flowing through the first to fifth pin diodes is controlled by the control voltage, and the current is decreased in association with the rise in the level of the QPSK modulation signal.

According to the QPSK modulation signal receiving unit of the invention, an amplifier for amplifying the QPSK modulation signal is provided, and the first variable attenuater is provided at the next stage of the amplifier.

DETAILED DESCRIPTION OF THE PREFERRED EMBODIMENT

Figure 1:
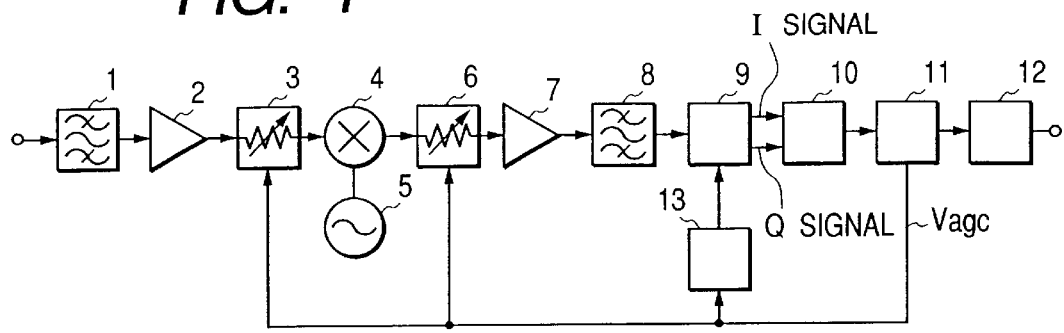
FIG. 1 is a block diagram of a QPSK modulation signal receiving unit of the invention.

A QPSK modulation signal receiving unit of the invention will be described with reference to FIGS. 1 to 4. A QPSK modulation signal such as a digital television signal which is sent from a broadcasting satellite and received by a parabolic antenna (not shown) mounted outdoors is subjected to frequency conversion by an outdoor converter installed outdoors and the resultant signal is supplied to a band-pass filter 1. The signal is then amplified by a low noise amplifier 2, passes through a first variable attenuater 3 as a first level changing means, and is supplied to a mixer 4. The QPSK modulation signal supplied to the mixer 4 is mixed with a local oscillation signal from a local oscillator 5 and is frequency converted into an intermediate frequency signal.

The intermediate frequency signal sequentially passes through a second variable attenuater 6 as a second level changing means, an intermediate frequency amplifier 7, and an intermediate frequency filter 8 and is supplied to an IQ demodulator 9. The IQ demodulator 9 separates the inputted intermediate frequency signal into an I signal and a Q signal whose phases are different from each other by 90 degrees and supplies the I and Q signals to an A/D converter 10. The A/D converter 10 converts the I and Q signals into a digital signal and supplies the digital signal to a QPSK demodulator 11. The QPSK demodulator 11 QPSK demodulates the digital signal and supplies the resultant signal to an error correcting circuit 12.

The attenuation amount of the first variable attenuater 3 is controlled so as to change and output the level of the inputted QPSK modulation signal. The attenuation amount of the second variable attenuater 6 is controlled so as to change and output the level of the supplied intermediate frequency signal. The gain of the IQ demodulator 9 is controlled so as to change and output the level of an IQ output signal. The attenuation amounts and gain are automatically controlled according to the level of the received QPSK modulation signal. Occurrence of a distortion in the mixer 4 and the intermediate frequency amplifier 7 is thereby suppressed and the operations of the IQ demodulator 9 and subsequent circuits are stabilized. The automatic gain control voltage Vagc as a control voltage for the control is proportional (or inverse proportional) to the level of the QPSK modulation signal and is generated from the QPSK demodulator 11.

Figure 2:
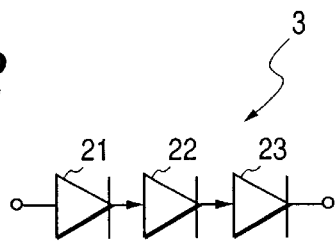
FIG. 2 is a circuit diagram of a first level changing means used for the QPSK modulation signal receiving unit of the invention.
Figure 3:
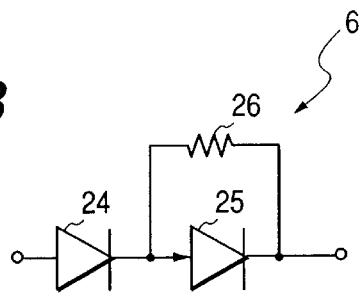
FIG. 3 is a circuit diagram of a second level changing means used for the QPSK modulation signal receiving unit of the invention.
Figure 5:
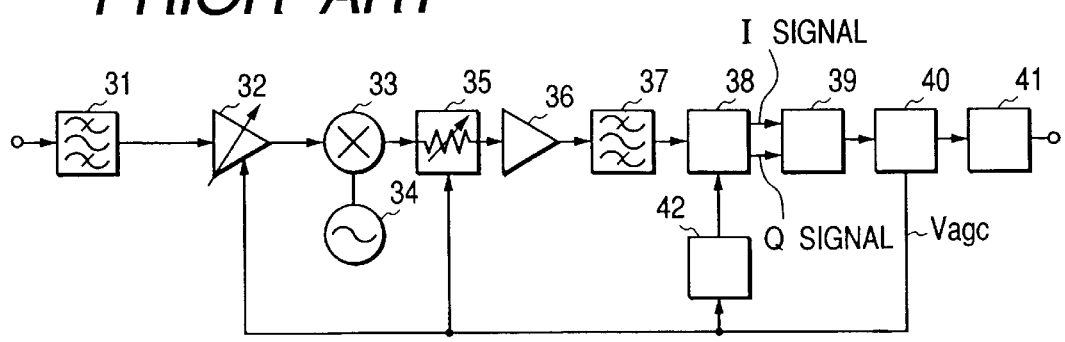
FIG. 5 is a block diagram of a conventional QPSK modulation signal receiving unit.

The automatic gain control voltage Vagc generated from the QPSK demodulator 11 is amplified by an operational amplifier 13 and supplied to the IQ demodulator 9. The automatic gain control voltage Vagc is supplied to both of the first variable attenuater 3 and the second variable attenuater 6. The first variable attenuater 3 is constructed by, as shown in FIG. 2, connecting three pin diodes 21, 22, and 23 in series. The second variable attenuater 6 comprises two pin diodes 24 and 25 which are connected in series and a resistor 26 connected to one, 25, of the pin diodes in parallel. The currents flowing through the pin diodes 21, 22, 23, 24, and 25 are controlled by the automatic gain control voltage Vagc.

Although not illustrated, a bias voltage is applied to each of the pin diodes 21, 22, and 23 in the first variable attenuater 3. When the automatic gain control voltage Vagc is low (when the level of the QPSK modulation signal is therefore low), a sufficient current flows through the pin diodes 21, 22, and 23 by the bias voltage and the impedance of each of the pin diodes 21, 22, and 23 is therefore low. As the automatic gain control voltage Vagc increases, the current flowing through the pin diodes 21, 22, and 23 decreases and the impedance of each of the pin diodes 21, 22, and 23 increases. Similarly, a bias voltage is applied to the pin diodes 24 and 25 in the second variable attenuater 6 and the impedance similarly changes according to the automatic gain control voltage Vagc. The resistor 26 in the second variable attenuater 6 is a resistor for damping and is used to optimize the maximum attenuation amount.

When the first variable attenuater 3 and the second variable attenuater 6 are compared with each other, the first variable attenuater 3 has the pin diodes more than the second variable attenuater 6 by one. Under the same automatic gain control voltage Vagc, the current flowing through the pin diodes 21, 22, and 23 in the first variable attenuater 3 is lower than the current flowing through the pin diodes 24 and 25 in the second variable attenuater 6. The first variable attenuater 3 therefore starts to attenuate at a stage where the level of the QPSK modulation signal is lower as compared with the second variable attenuater 6.

On the other hand, since the automatic gain voltage amplified by the operational amplifier 13 is supplied to the IQ demodulator 9, the level of the QPSK modulation signal received when the gain attenuation of the IQ demodulator 9 is started is lower than the level of the QPSK modulation signal received when the attenuation of the first variable attenuater 3 is started.

As a result, when the level of the inputted QPSK modulation signal rises to, for example, minus 70 dBm as a first level, the attenuation of the gain of the IQ demodulator 9 starts first. For example, when the level of the QPSK modulation signal becomes minus 55 dBm as a second level, the attenuation amount of the first variable attenuater 3 starts to increase. Further, when the level of the QPSK modulation signal further rises to, for instance, minus 35 dBm as a third level, the attenuation amount of the second variable attenuater 6 starts to increase.

Figure 4:
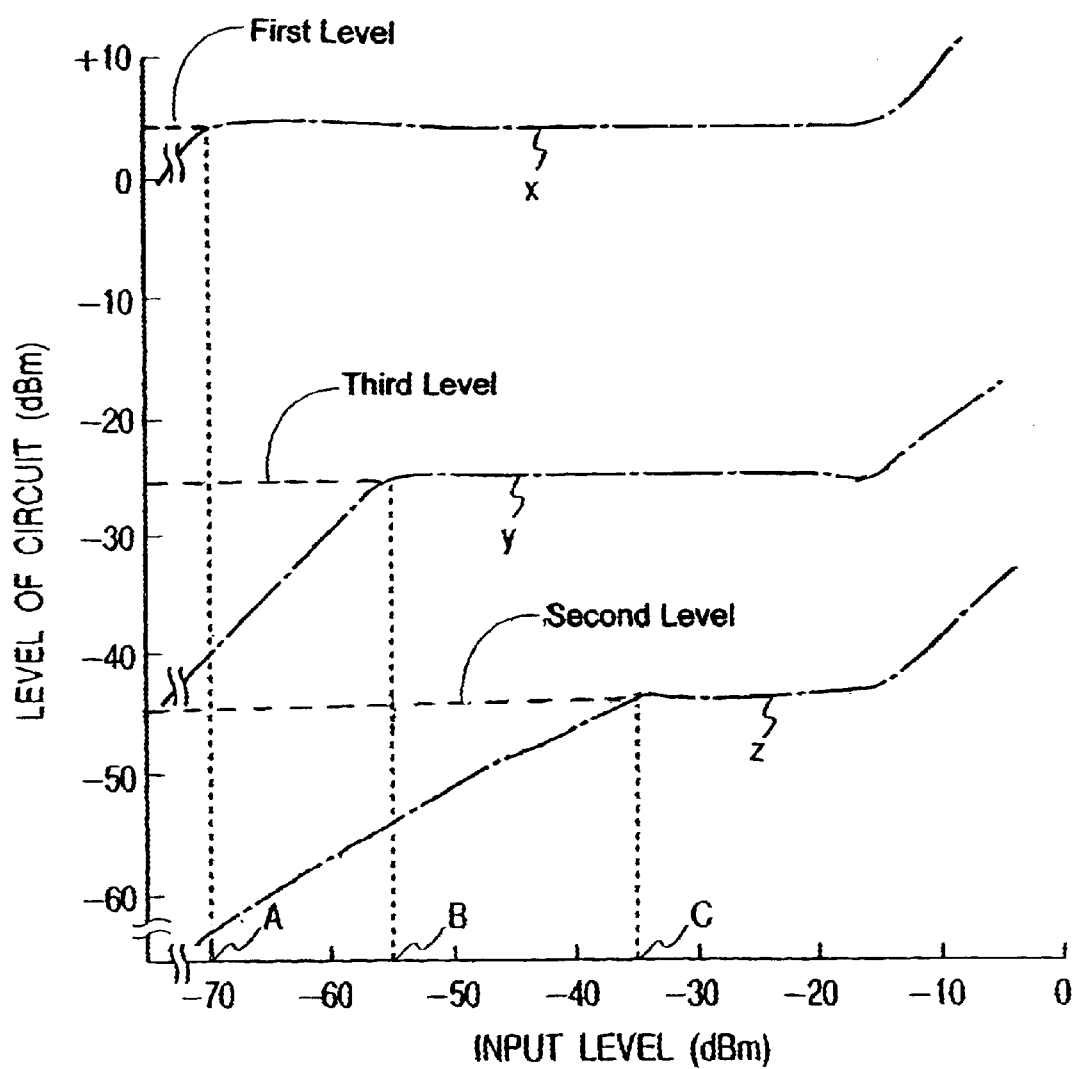
FIG. 4 is a characteristic diagram of the level change in the QPSK modulation signal receiving unit of the invention.
Figure 6:
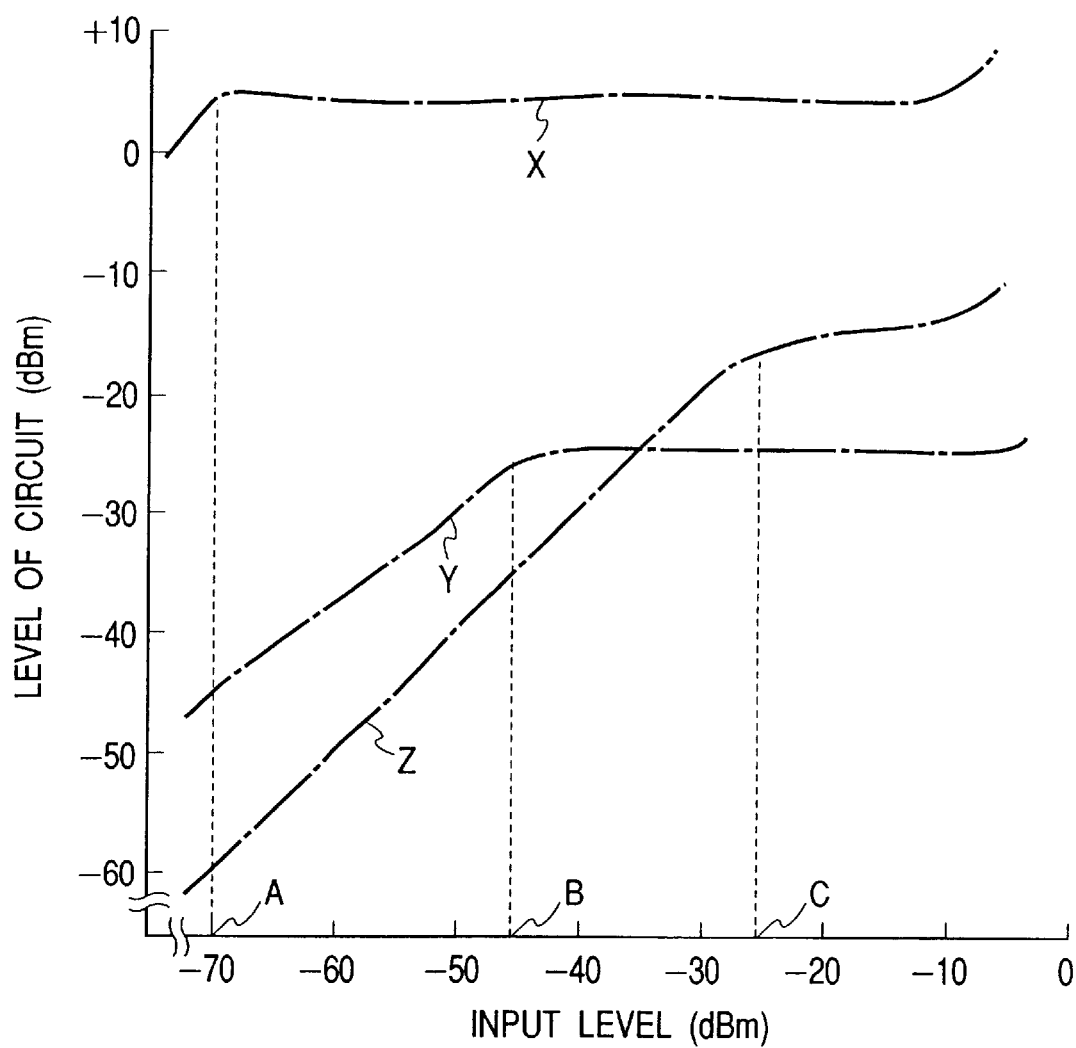
FIG. 6 is a characteristic diagram of the level change in the conventional QPSK modulation signal receiving unit.

FIG. 4 shows the automatic gain control characteristics of an output level (indicated by curve x) of the IQ demodulator 9 for the input level (reception level) of the QPSK modulation signal, the input level (indicated by curve y) of the IQ demodulator 9 and an input level (indicated by curve z) of the mixer 4.

In FIG. 4, since the automatic gain control does not operate until the level of the received QPSK modulation signal rises to the first level A, each of the output level of the IQ demodulator 9, the input level of the IQ demodulator 9, and the input level of the mixer 4 rises according to the rise in the input level of the QPSK modulation signal. Since the gain attenuation of the IQ demodulator 9 starts at the time point when the input level of the QPSK modulation signal reaches the first level A, the output level of the IQ demodulator 9 becomes almost constant (about plus 4 dBm) even if the level of the QPSK modulation signal rises after that.

At the time point when the input level of the QPSK modulation signal reaches the second level B, the attenuation amount of the first variable attenuater 3 starts to increase, so that the input level of the mixer 4 becomes almost constant (about minus 45 dBm). The input level of the mixer 4 is consequently regulated at the time point of the second level B of the QPSK modulation signal. Since the input level of the mixer 4 is regulated, the input level of the IQ demodulator 9 is also regulated so as to be almost constant (about minus 25 dBm).

In the interval between the first level A and the second level B, each of the input level of the IQ demodulator 9 and the input level of the mixer 4 rises in association with the rise in the input level of the QPSK modulation signal.

At the time point when the input level of the QPSK modulation signal reaches the third level C, the attenuation amount of the second variable attenuater 6 starts to rise. The input and output levels of the IQ demodulator 9 become continuously constant. The reason why the input level of the mixer 4 rises from around the third level C is because that the attenuation amount of the first variable attenuater 3 enters a saturation state.

As described above, in the receiving unit of the invention, as the level of the QPSK modulation signal rises, the gain of the IQ demodulator 9 starts to be attenuated first, the attenuation amount of the first variable attenuater 3 starts to increase and, finally, the attenuation amount of the second variable attenuater 6 starts to increase, so that the rise in the input level of the mixer 4 is regulated at the time point when the QPSK modulation signal reaches the second level.

The level of the QPSK modulation signal leaked from the mixer 4 and supplied to the local oscillator 5 is therefore lowered. Thus, the phase noise of the local oscillation signal is reduced.

It is also possible to replace the low noise amplifier 2 and the first variable attenuater 3 with a variable gain amplifier as a first variable gain amplifier (not shown) and use the first gain variable amplifier as a first level changing means. From the viewpoint of the NF (noise figure), as illustrated in FIG. 1, it is more advantageous that the first variable attenuater 3 is provided at the next stage of the low noise amplifier 2 and the attenuation amount of the first variable attenuater is changed. Similarly, it is also possible to construct the second variable attenuater 6 and the intermediate frequency amplifier 7 by a variable gain amplifier as a second variable gain amplifier (not shown) and use the second variable gain amplifier as a second level changing means.

As mentioned above, according to the QPSK modulation signal receiving unit of the invention, the reduction in the output level of the IQ demodulator starts when the QPSK modulation signal is at the first level, the reduction in the output level of the first level changing means starts when the QPSK modulation signal is at the second level higher than the first level, and the reduction in the output level of the second level changing means starts when the QPSK modulation signal is at the third level higher than the second level. Consequently, the increase in the input level of the mixer is regulated at the time point when the QPSK modulation signal reaches the second level.

The level of the QPSK modulation signal leaked from the mixer and supplied to the local oscillator is therefore lowered. As a result, the phase noise of the local oscillation signal is reduced.

According to the QPSK modulation signal receiving unit of the invention, the control voltage is generated by the QPSK demodulator, the first level changing means is constructed by the first variable attenuater made up of the first, second, and third pin diodes which are connected in series, the second level changing means is constructed by the second variable attenuater made up of the fourth and fifth pin diodes which are connected in series, the current flowing through the first to fifth pin diodes is controlled by the control voltage, and the current is decreased in association with the rise in the level of the QPSK modulation signal. Under the same control voltage, the current flowing through the pin diodes in the first variable attenuater is lower than that flowing through the pin diodes in the second variable attenuater. The attenuation in the first variable attenuater starts at a stage where the level of the QPSK modulation signal is lower as compared with the second variable attenuater.

According to the QPSK modulation signal receiving unit of the invention, since an amplifier for amplifying the QPSK modulation signal is provided and a first variable attenuater is provided at the next stage of the amplifier, the attenuation is controlled by the first variable attenuater after the QPSK modulation signal is amplified by the amplifier. Thus, the NF is improved.

What is claimed is:

1. A QPSK modulation signal receiving unit comprising:
   first level changing means for receiving a QPSK modulation signal, changing a level of the received QPSK modulation signal and outputting the QPSK modulation signal having the level changed;

a mixer for frequency converting the QPSK modulation signal outputted from the first level changing means and outputting an intermediate frequency signal;

second level changing means for changing the level of the intermediate frequency signal outputted from the mixer and outputting the QPSK modulation signal having its level changed;

an IQ demodulator for demodulating the intermediate frequency signal outputted from the second level changing means, generating a first intermediate frequency signal and a second intermediate frequency signal whose phases are different from each other by 90 degrees, changing the levels of the first and second intermediate frequency signals, and outputting the first intermediate frequency signal and the second intermediate frequency signal having their levels changed;

an A/D converter for converting the first and second intermediate frequency signals outputted from the IQ demodulator into digital signals;

a QPSK demodulator for demodulating the digital signals outputted from the A/D converter and outputting a QPSK signal;

wherein the first level changing means and the second level changing means respectively comprises a first variable attenuator and a second variable attenuator:

wherein a preset output level of the IQ demodulator is set as a first level;

wherein a preset input level of the mixer is set as a second level smaller than the first level;

wherein a preset input level of the IQ demodulator is set as a third level smaller than the first level but greater than the second level;

wherein reduction in the output level of the IQ demodulator does not start when the output level of the IQ demodulator is less than the first level, and reduction in the output level of the IQ demodulator starts when the output level of the IQ demodulator reaches the first level;

wherein reduction in the output level of the first level changing means starts when the input level of the mixer reaches the second level; and wherein reduction in the output level of the second level changing means starts when the input level of the IQ demodulator is at the third level and the input level of the mixer exceeds the second level.

2. A QPSK modulation signal receiving unit according to claim 1, wherein a control voltage for changing the output levels of the first level changing means, the second level changing means, and the IQ demodulator is generated by the QPSK demodulator, the first variable attenuator is comprised of a first pin diode, a second pin diode and a third pin diode, wherein the first pin diode, the second pin diode and the third pin diode are connected in series, the second variable attenuator is comprised of a fourth pin diode and a fifth pin diode, wherein the fourth pin diode and the fifth pin diode are connected in series, and a current flowing through the first to fifth pin diodes is controlled by the control voltage, and the current is decreased in association with the rise in the level of the QPSK modulation signal.

3. A QPSK modulation signal receiving unit according to claim 2, further comprising an amplifier which amplifies the QPSK modulation signal, and the first variable attenuater is provided at the next stage of the amplifier.

* * * * *